United States Patent [19]
Jarwala et al.

[11] Patent Number: 5,155,732
[45] Date of Patent: Oct. 13, 1992

[54] METHOD AND APPARATUS FOR DATA TRANSFER TO AND FROM DEVICES THROUGH A BOUNDARY-SCAN TEST ACCESS PORT

[75] Inventors: Najmi T. Jarwala, Plainsboro, N.J.; Chi W. Yau, Holland, Pa.

[73] Assignee: AT&T Bell Laboratories, Murray Hill, N.J.

[21] Appl. No.: 594,516

[22] Filed: Oct. 9, 1990

[51] Int. Cl.$^5$ .............................................. G01R 31/28
[52] U.S. Cl. .................................. 371/22.3; 324/73.1; 324/158 R
[58] Field of Search .................... 371/22.3, 21.2, 22.6; 324/73.1, 158 R

[56] References Cited

U.S. PATENT DOCUMENTS

| | | | |
|---|---|---|---|
| 4,534,028 | 8/1985 | Trischler | 371/22.3 |
| 4,827,476 | 5/1989 | Garcia | 371/22.3 |
| 4,872,169 | 10/1989 | Whetsel | 371/22.3 |
| 4,947,357 | 8/1990 | Stewart et al. | 371/22.3 |
| 5,079,725 | 1/1992 | Geer et al. | 371/22.3 |

Primary Examiner—Robert W. Beausoliel
Assistant Examiner—Dieu-Minh Le
Attorney, Agent, or Firm—R. B. Levy

[57] ABSTRACT

A scheme is provided for efficient transfer of N separate L-bit segments of data (where N and L are integers) to or from an L-bit register (14) in a device under test (10) serially coupled with at least one other register in a device (10') in a scan chain. To carry out such data transfer, a stream of N L-bit segments of interest is first concatenated to, and ahead of, a packet of $L_1$ filler bits, where $L_1$ is the cumulative number of register cells in the chain of devices (10') upstream of the L-bit register (14) in the device under test (10). The stream of $L_1 + NL$ bits is applied to the chain by shifting the first $L_1$ bits of the block of NL bits through the chain to flush the previous data stored in the registers upstream of the L-bit register in the device under test (10). The remaining bits in the stream of $L_1 + NL$ bits are then shifted through the chain of devices (10 and 10') until the $L_1$ filler bits have been shifted into the data registers of the devices (10') upstream of the device under test. An alternate data transfer scheme is also provided.

4 Claims, 2 Drawing Sheets

METHOD AND APPARATUS FOR DATA TRANSFER TO AND FROM DEVICES THROUGH A BOUNDARY-SCAN TEST ACCESS PORT

TECHNICAL FIELD

This invention is directed to a technique for efficiently transferring data to and from one or more devices serially connected in a boundary-scan chain for testing purposes.

BACKGROUND OF THE INVENTION

To overcome some of the deficiencies incurred by testing of circuit boards using conventional probing techniques, a testing technique known as boundary scan has been developed. Testing of a circuit board using the technique of boundary scan requires that each individual active device (i.e., an integrated circuit) on a circuit board be provided with a plurality of boundary-scan cells (single-bit shift registers) each connected to a separate input/output pin of the device. The boundary-scan cells in each device are coupled in a serial chain to form a boundary data register which is serially coupled with the boundary-scan register of the other devices to form a board level serial boundary-scan chain.

Testing of the devices coupled in such a serial boundary-scan chain is accomplished by shifting a stream of test bits into the chain of devices through a Test Access Port (TAP) on each device so that each bit in the stream, for interconnect test, is input to a corresponding one of the boundary-scan cells. The test bit input to each cell is then applied to the cell to update it, i.e., to replace the current value of the bit stored therein with the value of the test bit. As the bit within each boundary-scan cell associated with a device output pin is updated, the boundary-scan cells associated with each device input pin connected to this output pin will be further updated. By shifting out the bits from the boundary-scan chain after the boundary-scan registers have been updated, and by comparing the stream of bits shifted out to that expected for a chain of devices that is defect-free, a fault in any of the devices can be uncovered.

In the course of carrying out boundary-scan testing, there are circumstances when it is useful to load a test data register in a particular device in the chain with data via the boundary-scan Test Access Port (TAP). For example, a device, such as a microprocessor, might have its control store loaded with new micro-instructions, which, when executed, would cause the device to test itself. Presently, to load a plurality of L-bit segments into a test data register, successive blocks of data of the form $(L_1+L+L_2)$ bits must be shifted through the scan chain, where $L_1$ and $L_2$ are the cumulative numbers of scan cells in the chain upstream and downstream, respectively, of the test data register in the device to be loaded with data. The $L_1$ and $L_2$ bit strings preceding and succeeding, respectively, each L-bit segment of interest are chosen to be "don't care" values. To load the test data register with N separate L-bit segments, N data blocks or packets, each of the form $(L_1+L+L_2)$ bits, must be shifted through the boundary-scan chain.

The above-described data transfer scheme is very inefficient because every time a new L-bit segment is to be loaded into the test data register of a particular device, a stream of $(L_1+L+L_2)$ bits must be shifted through the entire chain, requiring at least $(L_1+L+L_2)$ clock cycles. Further, to load a large stream of L-bit segments at the device operating speed would require a very high transfer rate which may not be obtainable.

Thus, there is a need for an efficient technique for transferring data to and from a device in a scan chain.

SUMMARY OF THE INVENTION

Briefly, in accordance with a first preferred embodiment of the invention, a technique is disclosed for efficiently transferring data to or from an L-bit (where L is an integer) test data register within a device under test serially coupled with the data register in at least one other device in a boundary-scan chain. The technique is practiced by first concatenating the L-bit segments of data to be successively transferred into the L-bit test data register ahead of a stream of $L_1$ bits of don't care values where $L_1$ is the number of serially connected scan cells upstream of the test data register in the device to be loaded with data. Assuming that N successive L-bit segments are to be transferred (where N is an integer), the resultant data block or packet takes the form of a stream of $(L_1+NL)$ bits. Following the concatenation step, the first $L_1$ bits of the $(L_1+NL)$ bit block are shifted through the scan chain of devices so as to flush any remaining bits stored in the first $L_1$ boundary-scan cells. To determine when the first $L_1$ bits have been shifted, the device under test is provided with a down counter which is loaded with the value of $L_1$. Each time a successive one of the first $L_1$ bits of the block of $(L_1+NL)$ bits is shifted into a separate one of the first $L_1$ scan cells in the chain, the counter is decremented. Once the first $L_1$ bits of the stream of $(L_1+NL)$ bits have been shifted into the $L_1$ scan cells upstream of the test data register in the device to be loaded, then a successive one of the N L-bit segments is shifted into the test register so that data can be transferred to the device. Alternatively, data can be transferred from the device by causing the device to update, e.g., overwrite, the L-bit segment loaded into the scan data register with data from the device itself. When the last of the N L-bit segments has been loaded into the test data register in the device, then the remaining $L_1$ bits in the $L_1+NL$ bit block will have been shifted into a separate one of the $L_1$ scan cells in the scan chain upstream of the test data register in the device. In this way, the last $L_1$ bits of the last L-bit segment of data are "flushed" from the $L_1$ scan cells upstream of the test data register in the device.

In a second preferred embodiment, data transfer may be accomplished without the need to provide the device under test with an $L_1$-bit down counter. Instead, the addressing of the device to which the N L-bit segments are to be transferred is made to "wrap around," such that when a predetermined upper address value is reached, the addressing starts from zero, rather than freezing at the highest value. When utilizing this approach, the block of data to be read into the boundary-scan chain is obtained by concatenating a set of $L \lceil L_1/L \rceil - L_1$ filler bits (having "don't care" values) to, and ahead of, a data stream of $(L_1+NL)$ bits of interest, the last $L_1$ bits of which are don't care values. Within the group of N L-bits the $\lceil L_1/L \rceil$ segments which are to be read in first are placed at the end of the block. To load the device under test, the first packet of $\lceil L_1/L \rceil$ segments, which are don't care values, are shifted into the chain. Thereafter, the bits of each successive one of the next group of $N - \lceil L_1/L \rceil$ segments are shifted into the device under test each time the scan data register within the device is successively addressed. When the last of the segments in the block of $N-\lceil L_1/L\rceil$ bits are shifted into the device under test, the address point associated with the L-bit register in the device will wrap around so that the initial group of $\lceil L_1/L\rceil$ segments is overwritten with the proper data.

DETAILED DESCRIPTION

Figure 1:
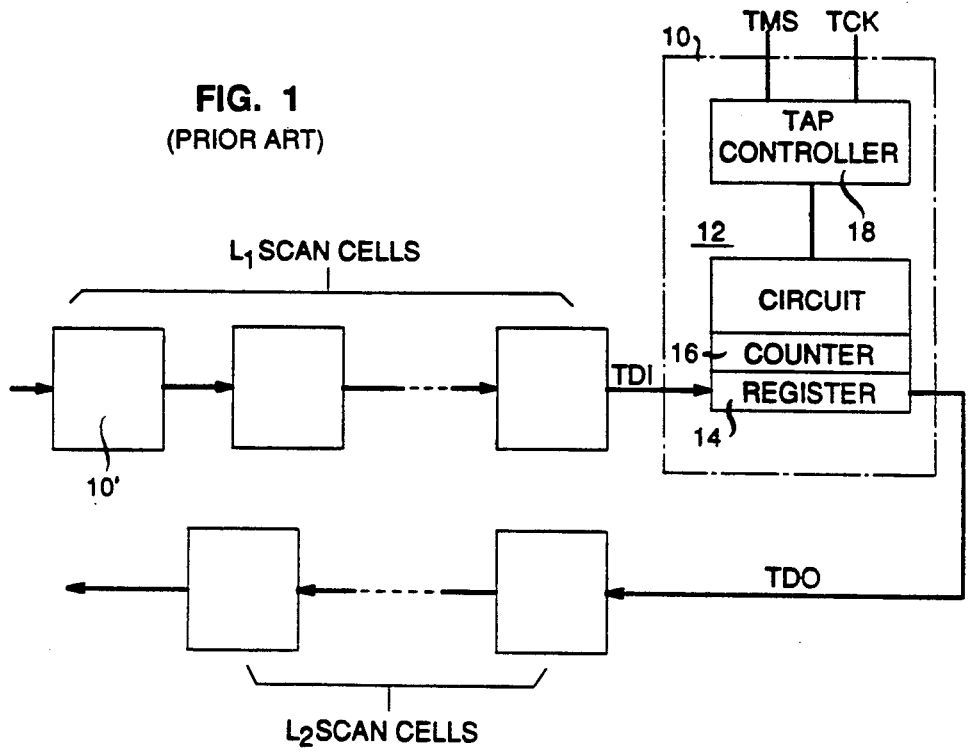
FIG. 1 is a block schematic diagram of a device under test coupled in a scan chain according to the prior art.

The present invention is directed to a scheme for achieving efficient data transfer to a test data register in a device under test, the register being serially coupled to a test data register in at least one other device in a scan chain. Referring to FIG. 1, there is shown a block schematic diagram of a prior-art device 10 which is to be tested using boundary-scan techniques. The device 10 (hereinafter referred to as the device under test) is typically an active device, such as a memory or a microprocessor or the like, having at least one circuit 12 therein to which input and output connections are made via a set of input/output pins (not shown). Associated with the circuit 12 within the device 10 is a register 14, referred to as the test data register, which is provided within the circuit to facilitate boundary scan testing thereof in accordance with the procedure outlined in IEEE STD P1149.1, described in the document *Standard Test Access Port and Boundary-Scan Architecture*, sponsored by the Test Technology Committee of the IEEE Computer Society, herein incorporated by reference. The test data register 14, assumed to be L bits long (i.e., the register has L individual cells (not shown)), is coupled in series with the test data register with at least one, and typically a plurality of other, devices 10' which may be similar to, or of a different construction from, the device 10 under test such that the register has its Test Data Input (TDI) coupled to the output of the last of the upstream cells, and its Test Data Output (TDO) coupled to the input of the first of the downstream cells. For purposes of illustration, it is assumed that there are $L_1$ cumulative scan (register) cells associated with the devices 10' upstream of the device 10 under test and $L_2$ cumulative scan cells associated with the devices downstream of the device under test.

The circuit 12 within the device 10, as well as the circuit within each of the other devices 10', may take various forms. For purposes of discussion, the circuit 12 is assumed to be a memory (e.g., a RAM). Associated with the memory 12 is an address counter 16 which serves to retain a value indicative of the location within the memory which is to store data, or from which data is to be read.

Control of test data register 14 within the device 10 is accomplished by a Test Access Port controller (TAP) 18 whose details are discussed in the previously-mentioned *Standard Test Access Port and Boundary-Scan Architecture* document.

Figure 2:
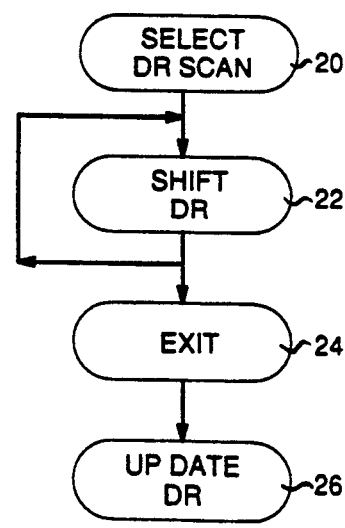
FIG. 2 is a flowchart diagram showing a process according to the prior art for shifting data into and out of the device of FIG. 1.

Among the operations controlled by the TAP controller 18 is the shift operation during which bits in a data stream are shifted through the device 10 and the devices 10' in the same serial chain. For purposes of discussion, the operation of the TAP controller 18 will be described assuming that $(L_1+L+L_2)$ bits are to be shifted through the device 10 and the devices 10' which are upstream and downstream therefrom. Referring now to FIG. 2, there is shown in flowchart form a summary or conceptual representation of steps executed by the TAP controller 18 of FIG. 1 to carry out shifting of data bits through the chain of devices 10.

The first step (step 20) undertaken by the TAP controller 18 of FIG. 1 is to select the data register scan (shift) operation. Step 20 is initiated when the TAP controller 18 of FIG. 1 is supplied with a Test Mode Select (TMS) signal of a particular sequence. Once the shift state is selected, then the TAP controller 18 causes the actual shifting of data (step 22). A successive one of the bits in the stream of test bits is shifted into a successive one of the cells in the register 14 in the boundary-scan chain in response to a successive "tick" (i.e., alternation of a periodic clock signal TCK input to the TAP controller 18). As indicated in FIG. 2, the shift step 22 is repeatedly executed to shift each of the bits in the stream of test bits $(L_1+L+L_2)$ into a separate one of the $(L_1+L+L_2)$ cells in the chain of devices 10 and 10'. Following the shift step 22, the shifting operation is exited (step 24) whereupon an update operation (step 26) is executed during which the bit in each cell of each test data register 14 is applied to the corresponding input/output pin of the circuit 12 of FIG. 1.

During instances other than when carrying out boundary-scan testing as described, it is useful to load the test data register 14 within the device 10 under test with data. Using the above-described scheme for carrying out data transfer, loading of a successive one of an arbitrarily large number (N) of L-bit blocks of data $L_A, L_B, L_C \ldots L_N$ would be carried out as follows. First, a block of bits $(L_1+L_A+L_2)$ would be shifted through the chain of devices 10 and 10', where the first and last group of $L_1$ and $L_2$ bits, respectively, in the block are "don't care" values. Successive blocks of bits $(L_1+L_B+L_2), (L_1+L_C+L_2) \ldots (L_1+L_N+L_2)$ would then be shifted through the chain of devices 10 and 10'. The strings of $L_1$ and $L_2$ bits of don't care values are necessary to insure that each of the L-bit segments $L_A, L_B, L_C \ldots L_N$ is properly positioned for loading in the test data register 14.

The above-described process of loading data into the test data register 14 of the device under test 10 is very cumbersome. Because of the need to concatenate each of the N segments $L_A, L_B, L_C \ldots L_N$ (where there can be an arbitrarily large number of segments) with an upstream and downstream string of $L_1$ and $L_2$ don't care values, respectively, at least $L_1+L+L_2$ clock cycles are consumed each time a successive one of the data blocks $L_A, L_B, L_C \ldots L_N$ is loaded. Depending on the size of the $L_1$ and $L_2$ bit strings, the number of such cycles can be large, resulting in a significant degree of inefficiency.

Figure 3:
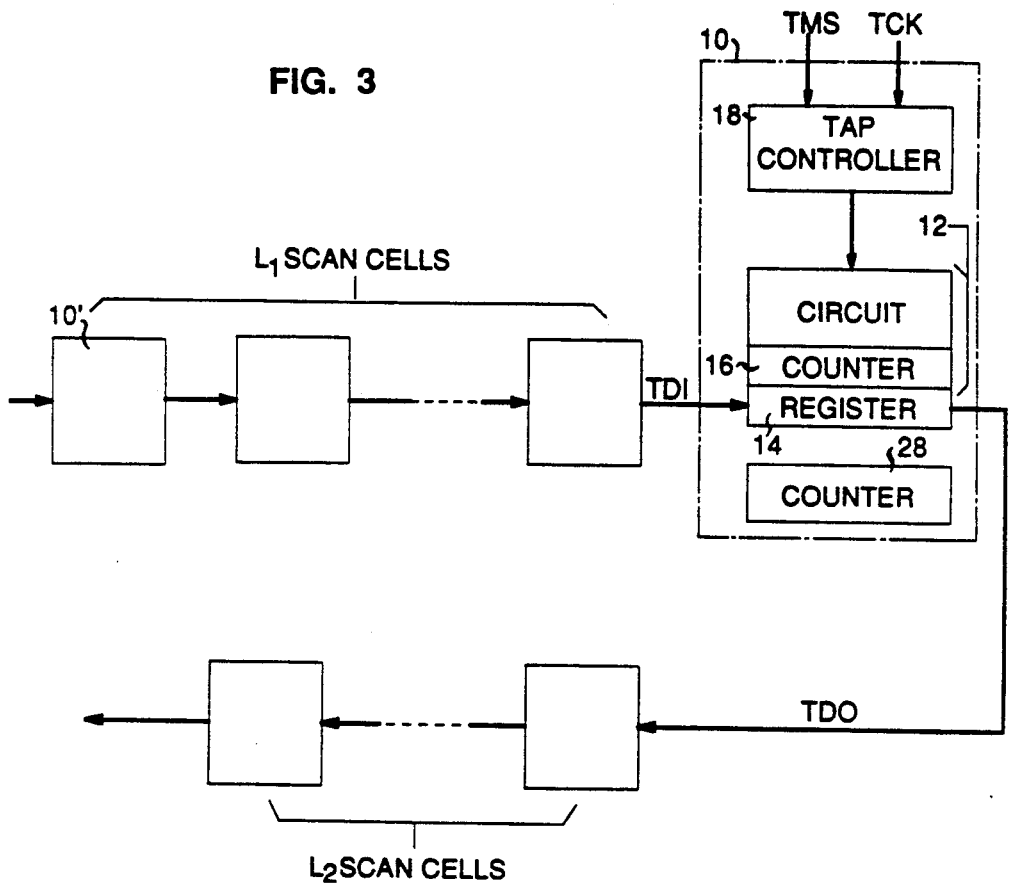
FIG. 3 is a block schematic diagram of the scan chain of FIG. 1, showing how the device under test is modified in accordance with the invention to accomplish more efficient data transfer thereto and therefrom.

In accordance with a first embodiment of the invention, efficient data transfer to and from the device under test 10 may be accomplished by modifying the device, as shown in FIG. 3, to incorporate a down-counter 28 which is controlled by the TAP controller 18. When the TAP 18 enters the shift state (step 22 of FIG. 2), the counter 28, which is initially loaded with the value $L_1$, is decremented each time a successive bit of the data stream is shifted into a successive one of the boundary-scan cells 16 in the boundary-scan chain of devices 10.

Figure 4:
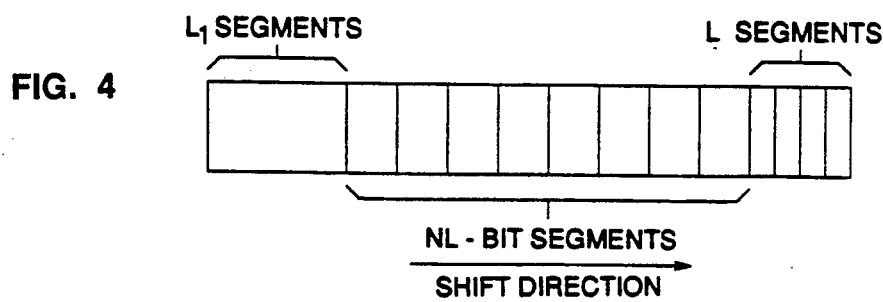
FIG. 4 is a block diagram of a data stream created for transfer to the device under test of FIG. 3.

In order to load the test data register 14 in the device under test 10 of FIG. 3 with a successive one of the segments of data $L_A, L_B, L_C \ldots L_N$, it is necessary to first concatenate these L-bit segments together ahead of a trailing block of $L_1$ filler bits of don't care values to establish a data block of the form $(L_1+NL)$ bits shown in FIG. 4. Following the concatenation operation, the TAP controller 18 of FIG. 1 executes the operations shown in FIG. 2 associated with data shifting to perform $L_1$ shift operations, with the counter 28 being decremented each time the shift step 22 is executed. The purpose in counting the first $L_1$ set of shift operations is to determine when the first $L_1$ bits in the data block $(L_1+NL)$ have been shifted into the $L_1$ boundary-scan cells of the test data registers 14 in the devices 10' upstream of the test data in the device under test 10 so as to flush the data previously contained in these upstream cells. Otherwise, the test data in the device under test 10 could be loaded with "old" (i.e., meaningless) data.

Once the down counter 28 has counted to zero, the NL successive shift operations (consuming NL clock cycles) are additionally carried out so that a separate one of the N L-bit segments $L_A, L_B, L_C \ldots L_N$ of interest is successively loaded into the boundary-scan data register 14. Every L clock cycles, a successive one of the L-bit segments then loaded into the test data register 14 is applied to the circuit 12 or, alternatively, the circuit applies a new L-bit segment to the register. In this way, the first N L-bit segments of the data block $(L_1+NL)$ are thus successively unpacked and loaded into the test data register 14 so that data can be transferred thereto or therefrom. The last $L_1$ bits of the data block $(L_1+NL)$ are provided to assure that the block is sufficiently long enough so that the last segments of interest up to 'N' can be successfully loaded when the last of the $L_1+NL$ shift operations is completed.

As compared to the prior art data transfer technique, the instant data transfer scheme is far more efficient. To transfer N separate L-bit segments of data, the total number of clock cycles required would be on the order of $L_1+NL$. By comparison, the prior art scheme would require $N(L_1+L+L_2)$ operations. Thus, with the instant scheme, data transfer can be accomplished more rapidly.

The instant data transfer technique, while described for transferring data to a single test data register 14, can easily be employed to transfer data to multiple test data registers within the scan chain comprised of the device 10 under test and the devices 10' upstream and downstream therefrom. To efficiently transfer data to multiple test data registers 14 in a scan chain, it would be necessary to concatenate the NL-bit segments to be transferred to each register behind the data block to be transferred to the register downstream therefrom. In addition, the counter 28 associated with each test data register 14 would have to be loaded with the appropriate value based on the number of scan cells in the test data registers upstream therefrom.

It is possible to achieve efficient transfer of data to and from the device under test 10 of FIG. 1 without having to modify the device to incorporate the down counter 28 of FIG. 3. Rather, the unpacking of a stream of bits of the form $(L_1+NL)$ can be achieved by controlling the manner in which the information from the test data register 14 is entered into the circuit 12, which, as previously indicated, is assumed to be a memory. As discussed previously, when the circuit 12 is a memory, then associated with it is the address counter 16 for storing the address of the location in the memory into which data is to be written or from which data is to be read.

Typically, the address counter 16 associated with the memory circuit 12 operates to count upward from the lowest memory address to the highest and then freeze at the highest value. Assuming that the memory 12 is comprised of 256 words (i.e., storage locations), the address register 16, once it has addressed the 256th word, would retain the address of that word. To efficiently load the circuit 12 with data from the test data register 14 in accordance with a second embodiment of the invention, control of the address counter 16 is altered, through a program instruction, so that the address register "wraps around," that is to say, it automatically returns to zero after addressing the 256th word.

Figure 5:
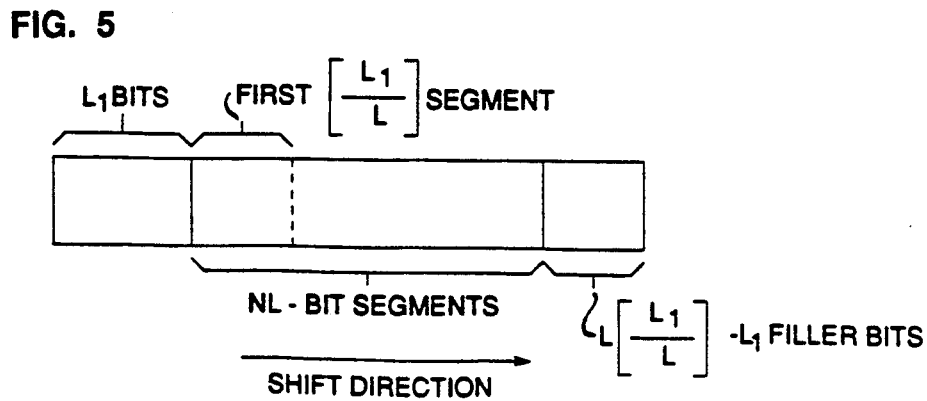
FIG. 5 is a block diagram of an alternate data stream created for transfer by the device under test of FIG. 1.

With the first embodiment of the invention described previously, the stream of data entered to the boundary-scan chain was obtained by concatenating N separate L-bit segments to, and ahead of, a stream of $L_1$ filler bits. However, a slightly different data stream format is necessary, in the absence of the counter 28 of FIG. 3, to accomplish efficient data transfer. Referring to FIG. 5, the data stream required for efficient data transfer contains an initial group of $L\lceil L_1/L\rceil - L_1$ filler bits of don't care value. The reason for providing such a group of bits at the head of the data stream of interest is to ensure that the bits previously existing in the $L_1$ upstream boundary-scan cells in the boundary-scan chain of devices 10', together with the group of $L\lceil L_1/L\rceil - L_1$ filler bits, comprises an integral number of L-bit segments. To the group of $L\lceil L_1/L\rceil - L_1$ filler bits, a block of N successive L-bit segments containing the data of interest is concatenated thereto, such that the first $L\lceil L_1/L\rceil$ bits in the block of NL bits lies at the end of the block. The reason for placing the first packet of $L\lceil L_1/L\rceil$ bits at the end of the block of NL bits will become better understood below. To the end of this block of $(NL+L\lceil L_1/L\rceil - L_1)$ bits is appended a packet of $L_1$ filler bits, as before, yielding a block of $(L_1+NL+L\lceil L_1/L\rceil - L_1)$ bits.

To load the bit stream of $(L_1+NL+L\lceil L_1/L\rceil - L_1)$, the TAP controller 18 of FIG. 1 enters its SHIFT state and commences the operations described in FIG. 3. As the shift operation 22 of FIG. 3 is successively carried out, the bits in the block $(L_1+NL+L\lceil L_1/L\rceil - L_1)$ are unpacked by the device under test 10. Since the first packet of $L\lceil L_1/L\rceil$ bits in the block are don't care values, the first $\lceil L_1/L\rceil$ storage locations in the memory circuit 12 will be filled with filler bits. The next $N - \lceil L_1/L\rceil$ segments which contain valid data will be properly stored in the corresponding locations in the memory circuit 12 in accordance with address information in the address register 14 of FIG. 1. After the last of the $N - \lceil L_1/L\rceil$ segments is stored, the value in the address register 15 wraps around to its lowest address value (zero) so that the initial $\lceil L_1/L\rceil$ segments in the memory circuit 12 are written over with valid data. The reason for placing the initial packet of $\lceil L_1/L\rceil$ segments in the data block of N L-bit segments is to compensate for the presence of $L_1$ scan cells of FIG. 1 in the devices 10' upstream of the device under test 10.

The total number of clock cycles required to transfer N separate L-bit segments of data using the above-described scheme will be on the order of $(L\lceil L_1/L\rceil + NL)$. As compared to the prior art transfer scheme which would require $N(L_1+L+L_2)$, the instant technique is thus far more efficient.

The foregoing describes a technique for efficiently transferring data to (and from) a device under test 10 serially coupled with other devices in a boundary-scan chain.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for efficiently transferring data to and from an L-bit data register (where L is an integer) within a device under test which is serially connected with a register of at least one other device in a scan chain, comprising the steps of:

concatenating N (where N is an integer) separate L-bit segments of data, each to be successively transferred to the L-bit register in the device under test, to a packet of $L_1$ filler bits of don't care values where $L_1$ is the cumulative number of the serially connected registers in the devices in the chain upstream of the L-bit register within the device under test, to yield a data stream of $L_1+NL$ bits;

successively shifting the first $L_1$ bits in the stream of $L_1+NL$ bits through the registers in the devices in that portion of the chain upstream of the L-bit register within the device under test to flush whatever data had been stored in the upstream registers; and shifting the remaining bits in the $L_1+NL$ bit stream through the chain of devices until a separate one of the $L_1$ filler bits in the stream is stored in a separate one of the registers in the devices in the chain upstream of the register in the device under test to load the register within the device under test with a successive one of the N L-bit segments of valid data.

2. The method according to claim 1 wherein the first shifting step includes the steps of:

loading a down counter with the value $L_1$ prior to shifting any of the bits in the stream of $(L_1+NL)$ bits into the chain of devices; and decrementing the counter each time a successive one of the first shifting operations occurs.

3. The method according to claim 1 wherein data is loaded into the L-bit data register within each of a plurality of devices under test serially coupled in a scan chain.

4. A method for efficiently transferring data to and from an L-bit data register (where L is an integer) within a device under test which is serially connected with a register of at least one other device in a chain, comprising the steps of:

concatenating a stream of $L\lceil L_1/L\rceil - L_1$ filler bits, where $L_1$ is the cumulative number of the serially connected registers in the devices in the chain upstream of the L-bit register within the device under test, to a packet of N (where N is an integer) separate L-bit segments of data, each to be successively transferred to the L-bit data register in the device under test such that the first packet of $\lceil L_1/L\rceil$ bits in the packet of NL bits to be transferred first to the L-bit boundary-scan data register of the device under test lies at the end of the packet of NL bits;

concatenating a packet of $L_1$ filler bits of don't care values to the stream of $(L\lceil L_1/L\rceil - L_1 + NL)$ bits to yield a data stream of $(L\lceil L_1/L\rceil - L_1 + NL + L_1)$ bits;

successively shifting the $(L\lceil L_1/L\rceil - L_1)$ bits in the stream of $(L\lceil L_1/L\rceil - L_1 + NL + L_1)$ bits through the registers in the devices lying in that portion of the chain upstream of the L-bit register within the device under test by causing the device under test to successively increment the address of the register, thereby flushing whatever data had been stored in the upstream registers and filling the first $L\lceil L_1/L\rceil$ cells in the register in the device under test with valid data; and shifting the remaining bits in the $L_1+NL$ bit stream through the chain of devices by causing the device under test to successively address the register such that addressing of the register is made to return to a zero address value once the highest address is reached, such shifting being carried out until a separate one of the $L_1$ filler bits in the stream is stored in a separate one of the registers in the devices in the chain upstream of the register in the device under test to load the register with the device under test with a successive one of the N L-bit segments of valid data.

* * * * *